United States Patent
Jin

(10) Patent No.: US 7,965,115 B2
(45) Date of Patent: Jun. 21, 2011

(54) SOFT REFERENCE SWITCH FOR PHASE LOCKED LOOP

(75) Inventor: Qu Gary Jin, Kanata (CA)

(73) Assignee: Zarlink Semiconductor Inc., Kanata, ON (CA)

( * ) Notice: Subject to any disclaimer, the term of this patent is extended or adjusted under 35 U.S.C. 154(b) by 0 days.

(21) Appl. No.: 12/617,347

(22) Filed: Nov. 12, 2009

(65) Prior Publication Data

US 2010/0134159 A1   Jun. 3, 2010

(30) Foreign Application Priority Data

Nov. 28, 2008 (GB) .................................. 0821772.1

(51) Int. Cl.
*H03L 7/06* (2006.01)
(52) U.S. Cl. ........ 327/147; 327/150; 327/156; 327/159; 331/11; 331/17; 331/25
(58) Field of Classification Search .................. 327/147, 327/148, 150, 156, 157, 159; 331/1 R, 10, 331/11, 17, 18, 25, 1 A
See application file for complete search history.

(56) References Cited

U.S. PATENT DOCUMENTS

| | | | | |
|---|---|---|---|---|
| 4,511,859 A | * | 4/1985 | Dombrowski | 331/11 |
| 4,538,120 A | * | 8/1985 | Hawkes | 331/12 |
| 4,835,481 A | * | 5/1989 | Geissler et al. | 327/156 |
| 5,666,084 A | | 9/1997 | Schulz et al. | |
| 6,114,920 A | * | 9/2000 | Moon et al. | 331/179 |
| 6,147,562 A | | 11/2000 | Quirmbach | |
| 2002/0061088 A1 | * | 5/2002 | Kon | 375/376 |
| 2008/0079510 A1 | | 4/2008 | Seethamraju et al. | |

* cited by examiner

*Primary Examiner* — Lincoln Donovan
*Assistant Examiner* — Patrick O'Neill
(74) *Attorney, Agent, or Firm* — Marks & Clerk; Richard J. Mitchell

(57) ABSTRACT

A phase locked loop includes a digital controlled oscillator and a number of phase detectors, each having a first input connected to a reference source and a second input coupled to the output of the digital controlled oscillator, and an output for producing a phase error signal. A loop filter coupled to the output of each phase detector has an output and a feedback input. An adjustment unit for derives an adjustment signal for the digital controlled oscillator from one or more of the loop filters by selecting or combining output signals from the loop filters taking into account the stability of said reference sources. The adjustment signal for the digital controlled oscillator produced by the adjustment unit is coupled to each of the feedback inputs of the loop filters. This arrangement results in hitless reference switching.

15 Claims, 3 Drawing Sheets

PRIOR ART

SOFT REFERENCE SWITCH FOR PHASE LOCKED LOOP

FIELD OF INVENTION

This invention relates to the field of phase locked loops (PLLs), and in particular to an automatic reference switch mechanism for phase lock synchronization.

BACKGROUND OF THE INVENTION

A traditional PLL reference switch is shown in FIG. 1. Phase detector PD determines the phase error ($P_{ref}$) between the selected reference and the output ($P_{dco}$) of the local digital controlled oscillator DCO. During normal operation, the PLL takes the selected reference clock, for example, $Pref_1$, and adjusts the DCO output frequency so that the DCO is locked to the selected reference. The output of the phase detector PD is therefore forced to zero. Traditional phase-locked techniques are described in F. M. Gardner, "Phase-Lock Techniques", New York: Wiley, 1979, the contents of which are herein incorporated by reference.

In FIG. 1, $F_c$ is the DCO center frequency. The output of the low pass filter (LP) creates the DCO frequency adjustment by filtering out the noise in the phase error. This is added to the center frequency of the DCO before being applied to the DCO input. When the selected reference $Pref_1$ becomes unavailable or unstable, the reference selection unit changes the reference to the other source, $Pref_m$, and DCO is then locked to the new reference. In general, all the references can be traced to a single source.

The problem the traditional method of switching references is that the initial phase offset will be different for different references and a phase correction has to be made during the switching operation. However, the actual phase may not be known exactly because both references will have noise in their phase. However, a phase error always exists during the switching operation, and its value depends on the stability of selected reference. This will result in a phase jump when the switch occurs.

Also, after switching, the low-pass filter still contains the memory of the phase error between local DCO and the first reference clock. This memory will affect the transit during the switching operation.

SUMMARY OF THE INVENTION

According to the present invention there is provided a phase locked loop comprising a digital controlled oscillator having an output; a plurality of phase detectors, each having a first input for connection to a reference source and a second input coupled to the output of the digital controlled oscillator, and an output for producing a phase error signal; a loop filter coupled to the output of each phase detector, each loop filter having an output and a feedback input; and an adjustment unit for deriving an adjustment signal for the digital controlled oscillator from one or more of said loop filters by selecting or combining output signals from said loop filters taking into account the stability of said reference sources, and wherein the adjustment signal for the digital controlled oscillator produced by said unit is coupled to each of said feedback inputs of said loop filters.

The reference switch in accordance with embodiments of the invention can make the switching operation smoother by estimating the phase error between local DCO and the second reference clock before switching occurs. This will maintain the continuity during switching. The implementation is simple in design and thus well suited for integration.

Unlike traditional switching methods, which switch reference sources instantaneously, the novel switching method switches gradually from one reference clock to another to achieve a hitless reference changeover. As a result, the local DCO does not experience any frequency or phase variation during the changeover.

Embodiments of the invention use a soft switch scheme wherein all reference clock information is combined to adjust the DCO. This combination is based on the statistics of each reference. The combination weights are adjusted for each sample interval so that the DCO will never experience any rapid change of reference source.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

Figure 1:
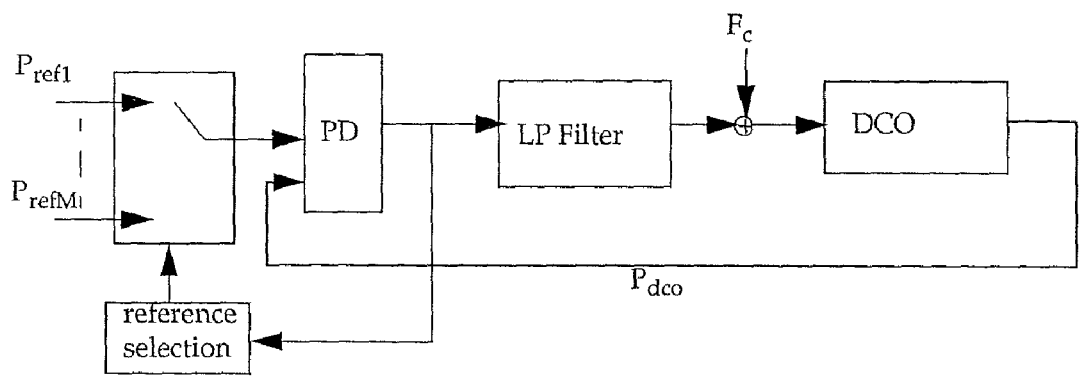
FIG. 1 is a block diagram of a prior art PLL.
Figure 2:
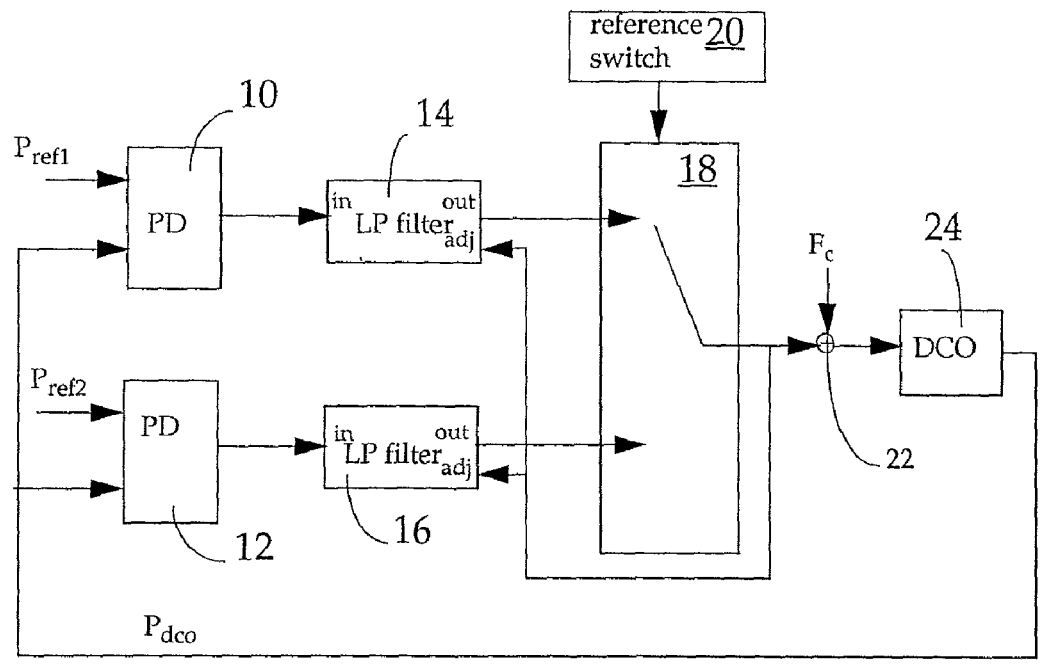
FIG. 2 is a block diagram of a first embodiment of a PLL in accordance with the invention.

Referring now to FIG. 2, the illustrated phase locked loop comprises two input phase detectors 10, 12, two loop filters 14, 16, a multiplexer or selection unit 18 controlled by switch controller 20, an adder 22 and a digital controlled oscillator 24.

When the phase of reference1 clock ($P_{ref1}$) is used to adjust DCO frequency, the DCO phase $P_{dco}$ returned by feedback loop 26 is synchronized with $P_{ref1}$ by means of phase detector 10 and low pass loop filter 14 in a conventional manner.

In the meantime, the other phase detector 12 also monitors the phase error between its reference phase ($P_{ref1}$) and the DCO phase by running in background. It uses the DCO frequency adjustment to predict the filter output.

In this scheme, the second reference tracks DCO phase constantly before the first reference fails. As soon as the first reference fails, the second reference will take the control DCO from the first reference using all the historical information collected. This will make the reference switch more smoothly.

Figure 3:
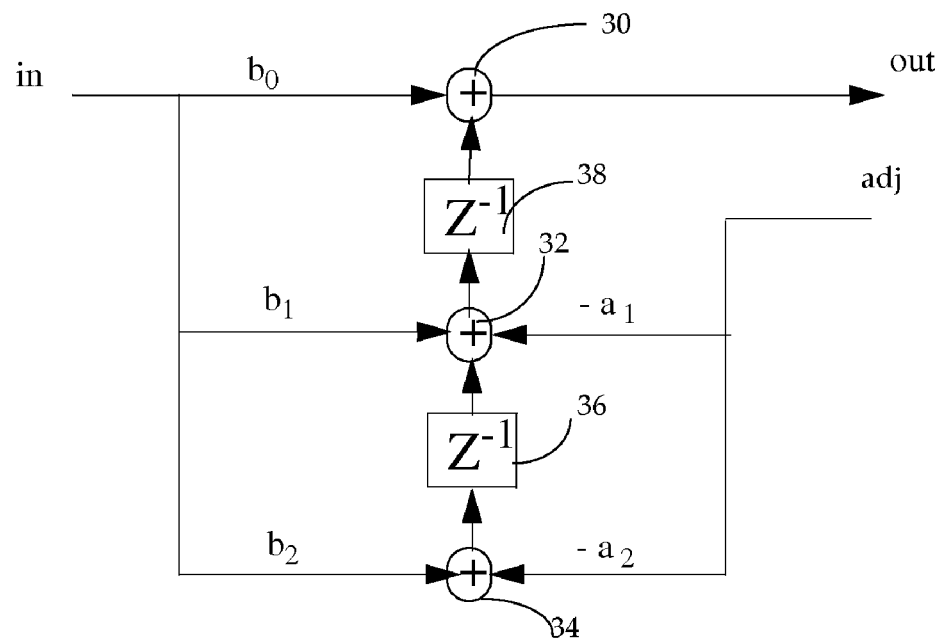
FIG. 3 shows the modified transposed direct-form $2^{nd}$ order IIR filter structure.

How the phase error and DCO frequency feedback are processed depends on the filter method used. Typically, a direct-form II, IIR filter is used for the loop filter. In this case, the digital loop filter is modified as shown in FIG. 3.

In the modified direct-form II 2nd order IIR filter, the input to the filter is the phase error from phase detector 10, 12. The value adj is the DCO frequency offset value output by the multiplexer 18, which is input as a feedback signal to the loop filter. The filter output is the intended DCO frequency adjustment ($a_n$ and $b_n$ are the filter coefficients).

This filter structure is different from the normal direct-form II IIR filter. A conventional loop filter includes a feedback signal adj to maintain the output of the loop filter constant in the absence of a change in the input signal from the phase detector. However, unlike the present invention, the feedback signal adj is coupled directly from the output of the loop filter, so in FIG. 3, the adj would be connected directly to out.

The input signal in is applied as inputs to adders 30, 32, 34 scaled by the respective filter coefficients $b_0$, $b_1$, $b_2$. The feedback signal adj, scaled by coefficients $-a_1$, $-a_2$, is applied to inputs of adders 32, 34.

The output of adder 34 is passed through delay unit 36 and applied as an input to adder 32. The output of adder 32 is passed through delay unit 38 and applied as an input to adder 30, which provides the output signal out.

Unlike a conventional filter, where the feedback signal adj is taken from the output of the filter, as shown in FIG. 2, the feedback value adj is the value taken from the active reference. Thus if, as shown, the loop filter 14 is active, then the value adj applied to both loop filters is the output of the loop filter 14. In this way, the inactive filter tracks the output of the active filter, and is ready to take over when the new reference is activated.

Figure 4:
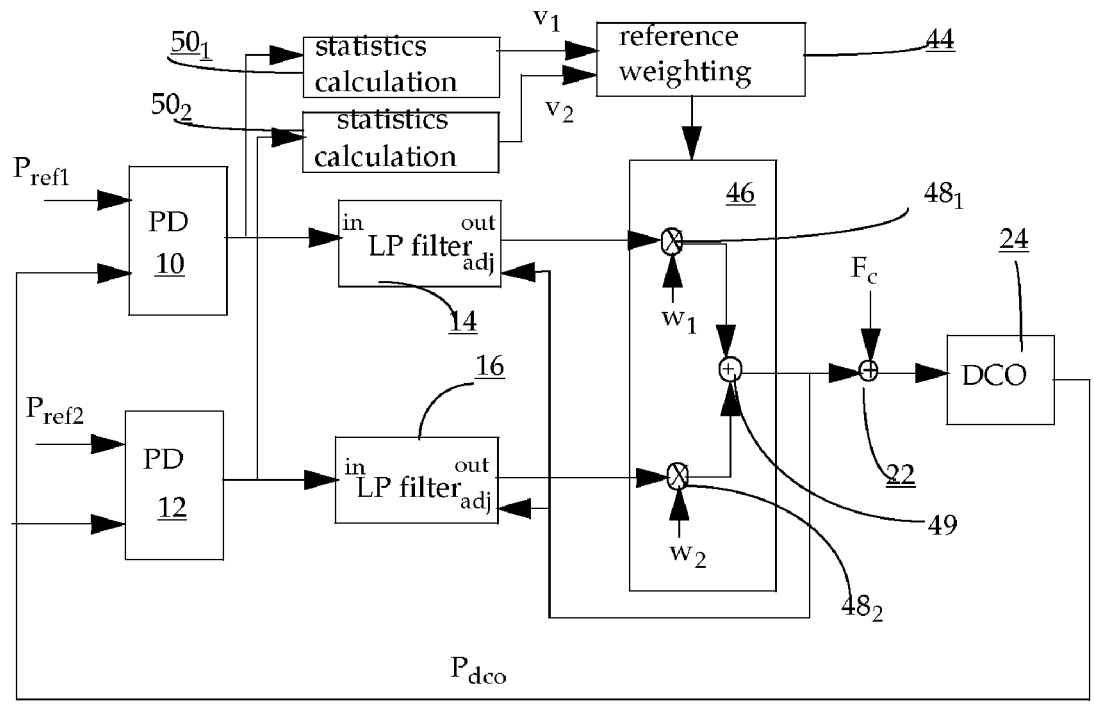
FIG. 4 is a block diagram of a soft hitless reference switch.

FIG. 4 shows a structure similar to FIG. 2, except that the DCO 24 adjustment is performed with the weighted output of the two low pass loop filters 14, 16. In this scheme, both reference clocks are used to adjust DCO phase.

The outputs of the phase detectors are coupled to statistics calculation units $50_1$, $50_2$, which produce output signals $v_1$, $v_2$ indicative of the stability of the reference clocks, and which are applied to weighting unit 44, which calculates the resulting weights $W_1$, $W_2$. In one embodiment, $v_1$, $v_2$ are the square roots of the variances of the variation in phase error for each of the phase detectors.

The outputs of the loop filters 14, 16 are then scaled by the weights $W_1$, $W_2$ by multipliers $48_1$, $48_2$ in weighting unit 46 and added by adder 49 to produce the adj output signal.

The weights $W_1$, $W_2$, depend on the stability statistics of each reference clock. If one reference clock is very stable, its weight should be close to 1, so that it contributes almost exclusively to the output, and if the reference clock is very noisy and becomes unavailable, its weight will be very small or close to zero. This makes the reference switch almost hitless.

The change can be done gradually and automatically.

In FIG. 4, the weight $w_n$ should satisfy the following conditions:

All weights are between 0 and 1:

$$0 \leq w_n \leq 1$$

The sum of all weights is equal to 1:

$$w_0 + w_1 = 1$$

Figure 5:
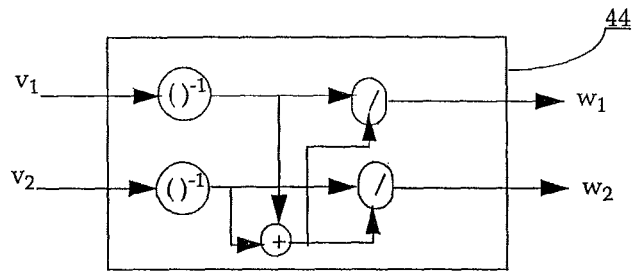
FIG. 5 illustrates the weight calculation for the two stage soft reference switch.

FIG. 5 shows a suitable weight calculation circuit 44 in more detail. Let the input ($v_n$) be the phase error variation of individual phase detector output, the weight will be $$w_n = \frac{1/v_n}{\sum_{k=0}^{1} 1/v_k}$$

There are many ways to check the reference stability by measuring the clock statistics.

Figure 6:
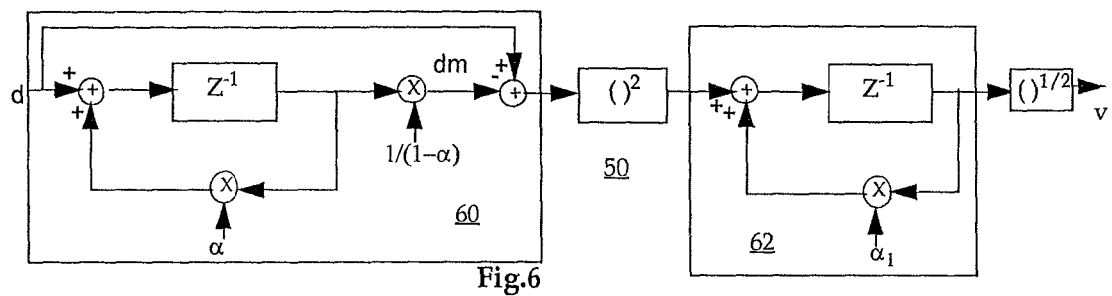
FIG. 6 illustrates the two-stage soft reference switch.

FIG. 6 shows the method for calculating clock statistics using the variance of phase error variation.

In FIG. 6, dm is the average phase error obtained by passing the instantaneous phase error d through a low pass filter 60. d-dm is the instantaneous phase error variation and its square is passed through another low pass filter 62. This give the variance of phase error variation. The output v is the square root of the variance. $\alpha$ and $\alpha_l$ are filter coefficients.

Figure 7:
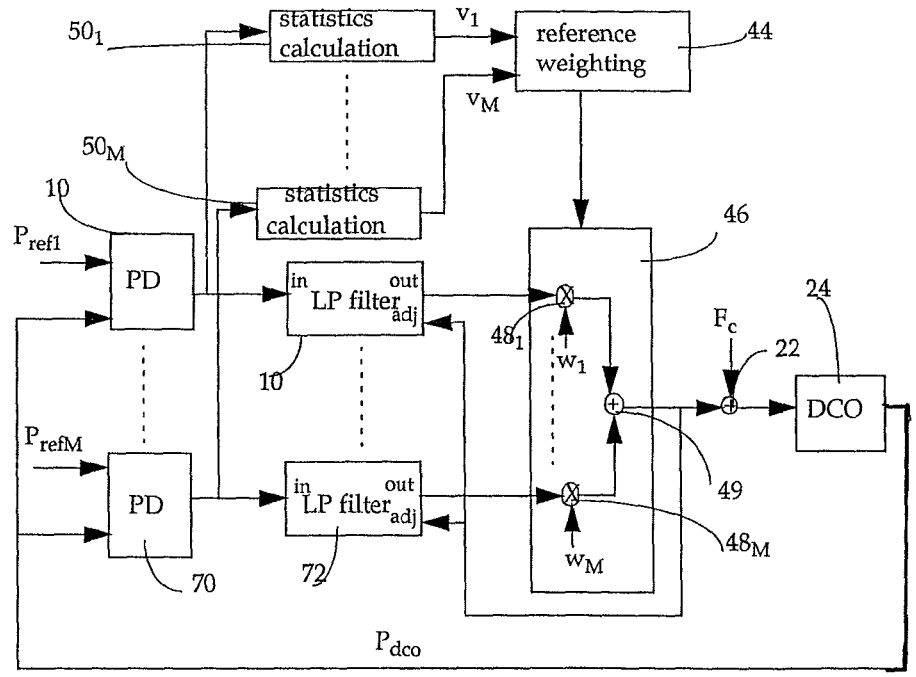
FIG. 7 illustrates a soft reference switch with multiple reference sources.

FIG. 7 shows a soft reference switch with multiple references, $\text{Pref}_{1 \ldots M}$, where M>2, and preferably substantially greater than two. These are connected to respective multiple phase detectors, of which the first 10, and last 70 are shown in FIG. 7.

The statistics of each reference is calculated in a calculation unit $50_1$ to $50_M$, as shown in more detail in FIG. 6. The weighting of each reference is determined in weighting unit 44 based on the stability of each reference by the following relationship:

$$w_n = \frac{1/v_n}{\sum_{k=0}^{M} 1/v_k}$$

The outputs of the respective loop filters 10 . . . 72 are weighted by the corresponding weights $W_1$ to $W_M$ in weighting unit 46 by multipliers $48_1$ . . . $48_M$ and added together in adder 40 to produce the adj output, which is added to the DCO center frequency in adder 22.

If one reference becomes unstable, its weight will be reduced gradually and the switch over to reliance mainly on the other reference becomes almost unnoticeable. Also, the reference switch occurs completely automatically without user interference.

If the user does not want to switch the reference, it is also possible to control the weights manually. They can also be based on statistics to pick desired reference to switch smoothly.

Whether the reference switching is done automatically or manually, the switch is always hitless because the historical information has been stored in the memory before the switching operation happens.

The simple implementation described above makes the circuit particularly suitable for integration.

The invention claimed is:

1. A phase locked loop comprising:
   a digital controlled oscillator having an output;
   a plurality of phase detectors, each having a first input for connection to a respective reference source and a second input coupled to the output of the digital controlled oscillator, and an output for producing a phase error signal;
   a respective loop filter coupled to the output of each phase detector, each loop filter having an output and a feedback input; and
   an adjustment unit for deriving an adjustment signal for the digital controlled oscillator from one or more of said loop filters by selecting or combining output signals from said loop filters taking into account the stability of said reference sources, and
   wherein the adjustment signal for the digital controlled oscillator produced by said adjustment unit is coupled to each of said feedback inputs of said loop filters.

2. A phase locked loop as claimed in claim 1, wherein said adjustment unit selects the output of one of said loop filters based on the stability of said reference sources.

3. A phase locked loop as claimed in claim 2, comprising two said phase detectors, and wherein said adjustment unit switches from one to the other depending on which reference source is most stable.

4. A phase locked loop as claimed in claim 1, wherein each said loop filter is a direct form II IIR filter with a separate input serving as said feedback input.

5. A phase locked loop as claimed in claim 4, wherein said direct form II IIR filter comprises a first adder adding a scaled version of an input signal to a scaled version of the adjustment signal, a second adder adding a scaled version of the input signal to a scaled version of the adjustment signal and a delayed version of the output of the first adder, and a third adder adding a scaled version of the input signal and a delayed version of the second adder to provide an output signal.

6. A phase locked loop as claimed in claim 1, wherein the adjustment unit derives a weighted sum of the outputs of the loop filters to produce said adjustment signal.

7. A phase locked loop as claimed in claim 6, further comprising a respective calculation unit coupled to each phase detector for producing a signal representative of the stability of the reference source, and a weighting unit coupled to the output of the calculation units for determining the weights to be applied to the outputs of the loop filters by said adjustment unit.

8. A phase locked loop as claimed in claim 7, wherein said calculation unit determines the variance of the phase error variation.

9. A phase locked loop as claimed in claim 8, wherein said calculation unit comprises a first low pass filter receiving the output of the phase detector, a squaring unit receiving the output of the first low pass filter, and a second low pass filter receiving the output of the squaring unit, and a square root unit receiving the output of the second low pass filter.

10. A phase locked loop as claimed in claim 6, wherein the adjustment unit comprises a plurality of multipliers for multiplying the outputs of the respective loop filters by the weight assigned to their corresponding inputs.

11. A phase locked loop as claimed in claim 6, comprising multiple phase detectors with corresponding references sources 1 . . . M, wherein M>2, and wherein a weight is assigned to each reference source.

12. A method of controlling a digital phase locked loop with a digital controlled oscillator and having a plurality of reference sources, comprising monitoring the stability of said reference sources, detecting a phase error for each reference source, filtering the phase error for each source with a corresponding loop filter, selecting one or a weighted combination of the outputs of the loop filters as an adjustment signal for the digital controlled oscillator, and feeding back the adjustment signal as a feedback signal to each of the loop filters.

13. A method as claimed in claim 12, wherein the stability is determined for each reference source, and the reference source with the greatest stability is selected to produce the adjustment signal for the digital controlled oscillator.

14. A method as claimed in claim 12, wherein stability statistics are calculated for each reference source, the reference sources are assigned weights dependent on their stability, and the weights are applied to the outputs of the corresponding loop filters to produce an adjustment signal that is the weighted sum of the outputs of the loop filters.

15. A method as claimed in claim 14, wherein the stability statistics are the variance of the phase error variation for each source.

* * * * *